(12) United States Patent
Slesazeck et al.

(10) Patent No.: US 10,424,379 B2
(45) Date of Patent: Sep. 24, 2019

(54) POLARIZATION-BASED CONFIGURABLE LOGIC GATE

(71) Applicant: NaMLab gGmbH, Dresden (DE)

(72) Inventors: Stefan Slesazeck, Arnsdorf (DE); Halid Mulaosmanovic, Dresden (DE); Evelyn Breyer, Weisswasser (DE)

(73) Assignee: NaMLab gGmbH, Dresden (DE)

( * ) Notice: Subject to any disclaimer, the term of this patent is extended or adjusted under 35 U.S.C. 154(b) by 0 days.

(21) Appl. No.: 15/829,076

(22) Filed: Dec. 1, 2017

(65) Prior Publication Data

US 2019/0172539 A1    Jun. 6, 2019

(51) Int. Cl.
   *G11C 11/22*    (2006.01)
   *H03K 19/0944*  (2006.01)
   *G11C 14/00*    (2006.01)
   *H01L 27/11507* (2017.01)
   *H01L 21/28*    (2006.01)
   *H01L 27/10*    (2006.01)
   *G11C 13/00*    (2006.01)

(52) U.S. Cl.
   CPC ........ *G11C 14/0072* (2013.01); *G11C 11/223* (2013.01); *G11C 13/0004* (2013.01); *G11C 14/009* (2013.01); *H01L 21/28291* (2013.01); *H01L 27/101* (2013.01); *H01L 27/11507* (2013.01); *H03K 19/0944* (2013.01)

(58) Field of Classification Search
   CPC ... G11C 11/223; H03K 19/09; H03K 19/0944
   See application file for complete search history.

(56) References Cited

U.S. PATENT DOCUMENTS

| 5,923,184 A * | 7/1999 | Ooms ............... H03K 19/08 326/121 |
| 7,256,622 B2 | 8/2007 | Dronavalli |
| 7,709,359 B2 | 5/2010 | Boescke et al. |
| 8,431,918 B2 | 4/2013 | Wirtz et al. |

(Continued)

FOREIGN PATENT DOCUMENTS

EP        1 608 071    12/2005

OTHER PUBLICATIONS

Qiangfei Xia, et al. "Memristor-CMOS Hybrid Integrated Circuits for Reconfigurable Logic", 2009 American Chemical Society, Published on Web Sep. 1, 2009.

(Continued)

*Primary Examiner* — Hoai V Ho
*Assistant Examiner* — Jay W. Radke
(74) *Attorney, Agent, or Firm* — Dicke, Billig & Czaja, PLLC

(57) ABSTRACT

A polarization-based logic gate includes a transistor having a drain and a polarizable material layer having at least two polarization states, the polarization state representing a first logic value, and a resistive element having a first terminal coupled to the drain and a second terminal. A plurality of input/output terminals connected to the transistor and second terminal of the resistive element so as to apply voltages to selected input/output terminals, including a sensing voltage representing a second logic value, with a resulting drain current of the transistor at least partially flowing through the resistive element and representing a result of a logic operation between the first logic value and the second logic value.

19 Claims, 15 Drawing Sheets

(56) References Cited

U.S. PATENT DOCUMENTS

| | | | | |
|---|---|---|---|---|
| 8,542,034 | B2* | 9/2013 | Kato | H03K 19/0013 326/104 |
| 2005/0206421 | A1* | 9/2005 | Nishikawa | G11C 11/22 327/203 |
| 2006/0114018 | A1* | 6/2006 | Sugahara | H01L 29/66984 326/36 |
| 2009/0059646 | A1* | 3/2009 | Takahashi | G11C 11/22 365/145 |
| 2012/0293242 | A1* | 11/2012 | Kato | H03K 19/0013 327/530 |
| 2018/0254350 | A1* | 9/2018 | Hatcher | H01L 29/78391 |

OTHER PUBLICATIONS

Qiangfei Xia, Nanoscale Resistive Switches: Devices, Fabrication and Integration, Applied Physics A, Materials Science & Processing, Published online Feb. 1, 2011.

J.M. Portal, et al. "Analytical Study of Complementary Memristive Synchronous Logic Gates", IEEE, 2013.

Wen-Pin Lin, et al. "A Nonvolatile Look-Up Table Using ReRAM for Reconfigurable Logic", IEEE Asian Solid-State Circuits Conference, Nov. 10-12, 2014.

An Chen, et al. Using Emerging Technologies for Hardware Security Beyond PUFs, EDAA, 2016.

Xunzhao Yin, et al. Exploiting Ferroelectric FETs for Low-Power Non-Volatile Logic-in-Memory Circuits, Nov. 7-10, 2016.

Giacomo Indiveri, Memory and Information Processing in Neuromorphic Systems, IEEE, vol. 103, No. 8, Aug. 8, 2015.

Duygu Kuzum, et al. "Nanoelectiric Programmable Synapses Based on Phase Change Materials for Brain-Inspired Computing", American Chemical Society, Published Jun. 14, 2011.

Shimeng Yu, et al. "An Electronic Synapse Device Based on Metal Oxide Resistive Switching Memory for Neuromorphic Computation", IEEE, vol. 58, No. 8, Aug. 2011.

H. Mulaosmanovic, et al. Switching Kinetics in Nanoscale Hafnium Oxide Based Ferroelectric Field-Effect Transistors, American Chemical Society, Published Jan. 10, 2017.

H. Mulaosmanovic, et al. Evidence of Single Domain Switching in Hafnium Oxide Based FeFETs: Enabler for Multi-Level FeFET Memory Cells, IEEE, 2015.

J. Mueller, et al. "Ferroelectricity in HfO2 enables Nonvolatile Data Storage in 28 nm HKMG", Symposium on VLSI Technology Digest of Technical Papers, 2012.

Y. Nishitani, et al. "Three-Terminal Ferroelectric Synapse Device with Concurrent Learning Function for Artifical Neural Networks", Journal of Applied Physics, 2012.

\* cited by examiner

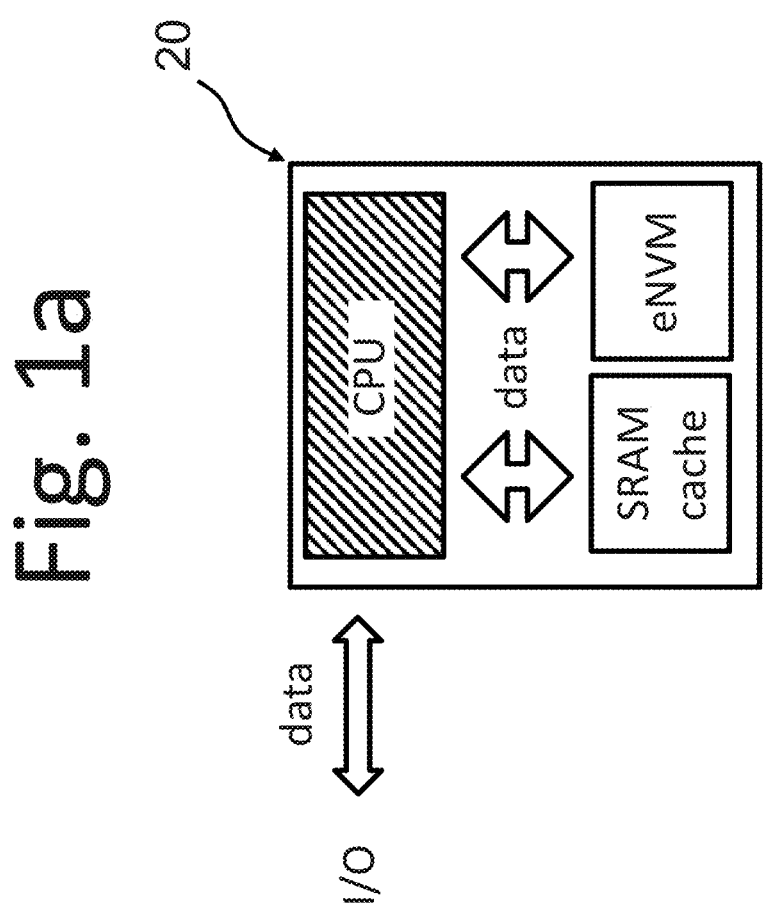

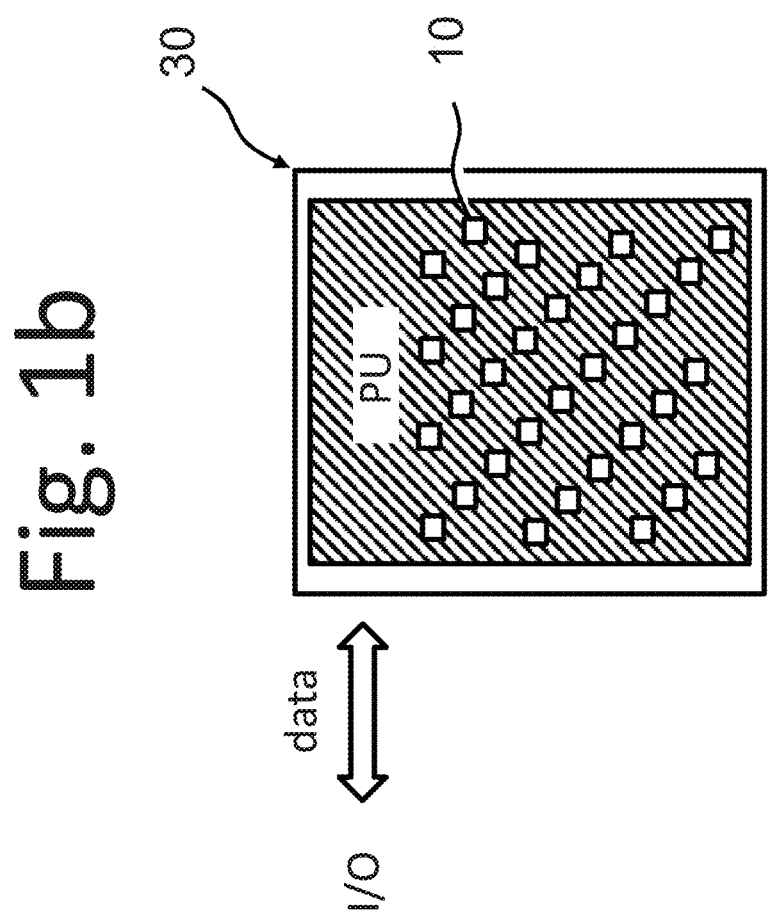

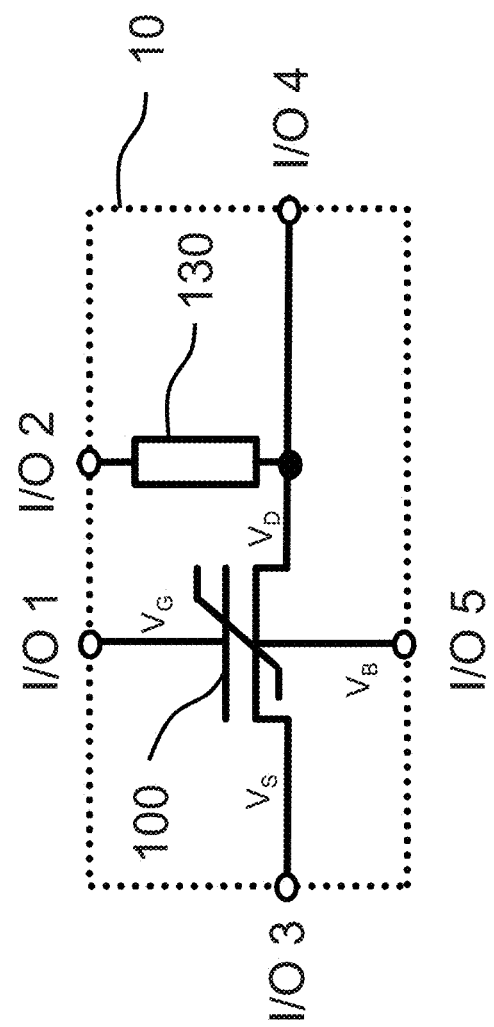

Fig. 3d

| | NAND read | | NOR read | | | Prg | Ers |
|---|---|---|---|---|---|---|---|
| second logic value | 0 | 1 | 0 | | 1 | | |
| Vg (V) (representing second logic value) | 0 | 1.5 | 0 | | 1.5 | 1.5 | -1.5 |
| Vs (V) | 0 | 0 | 0 | | 0 | -1.5 | 1.5 |
| Vgs (V) | 0 | 1.5 | 0 | | 1.5 | 3 | -3 |
| Vbb (V) | -1.5 | | | 0 | | * | * |
| FeFET (first logic value) | 0 | 1 | 0 | 1 | 0 | 1 | 0 | 1 | 0 | 1 |
| Vout (V) | 1.5 | 1.5 | 0 | 1.5 | 0 | 1.5 | 0 | 0 | | |
| logic output | 1 | 1 | 0 | 1 | 0 | 1 | 0 | 0 | | |

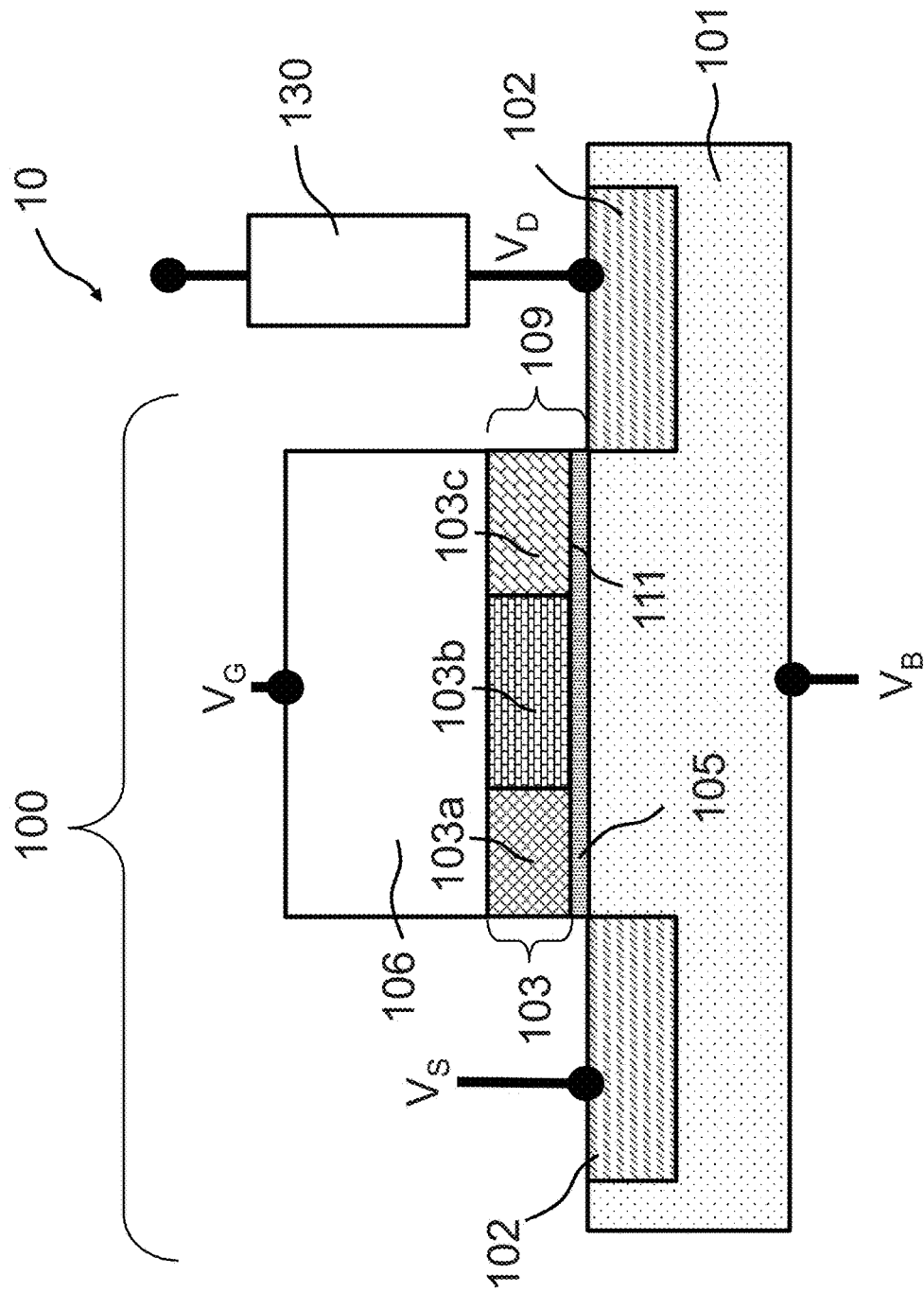

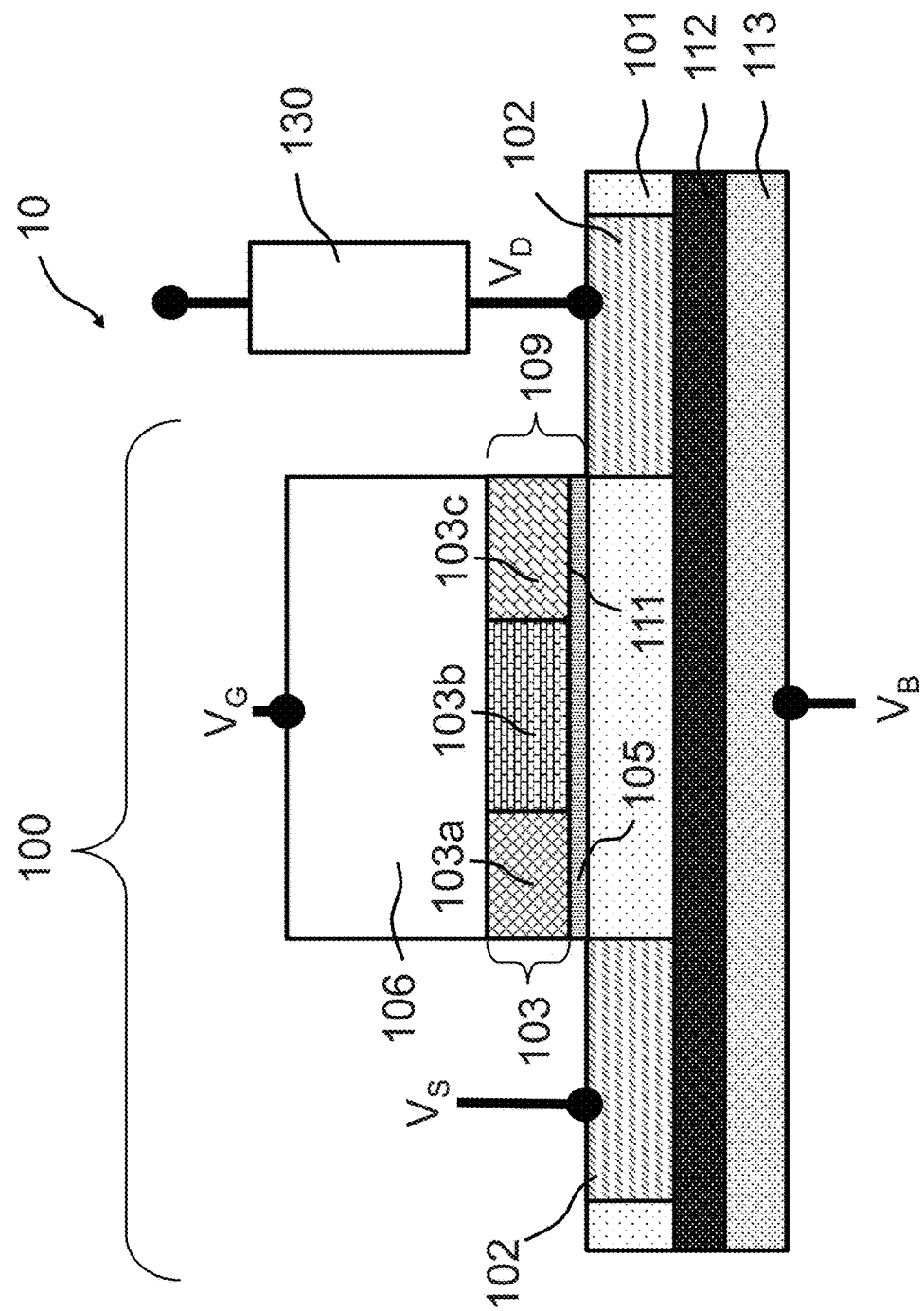

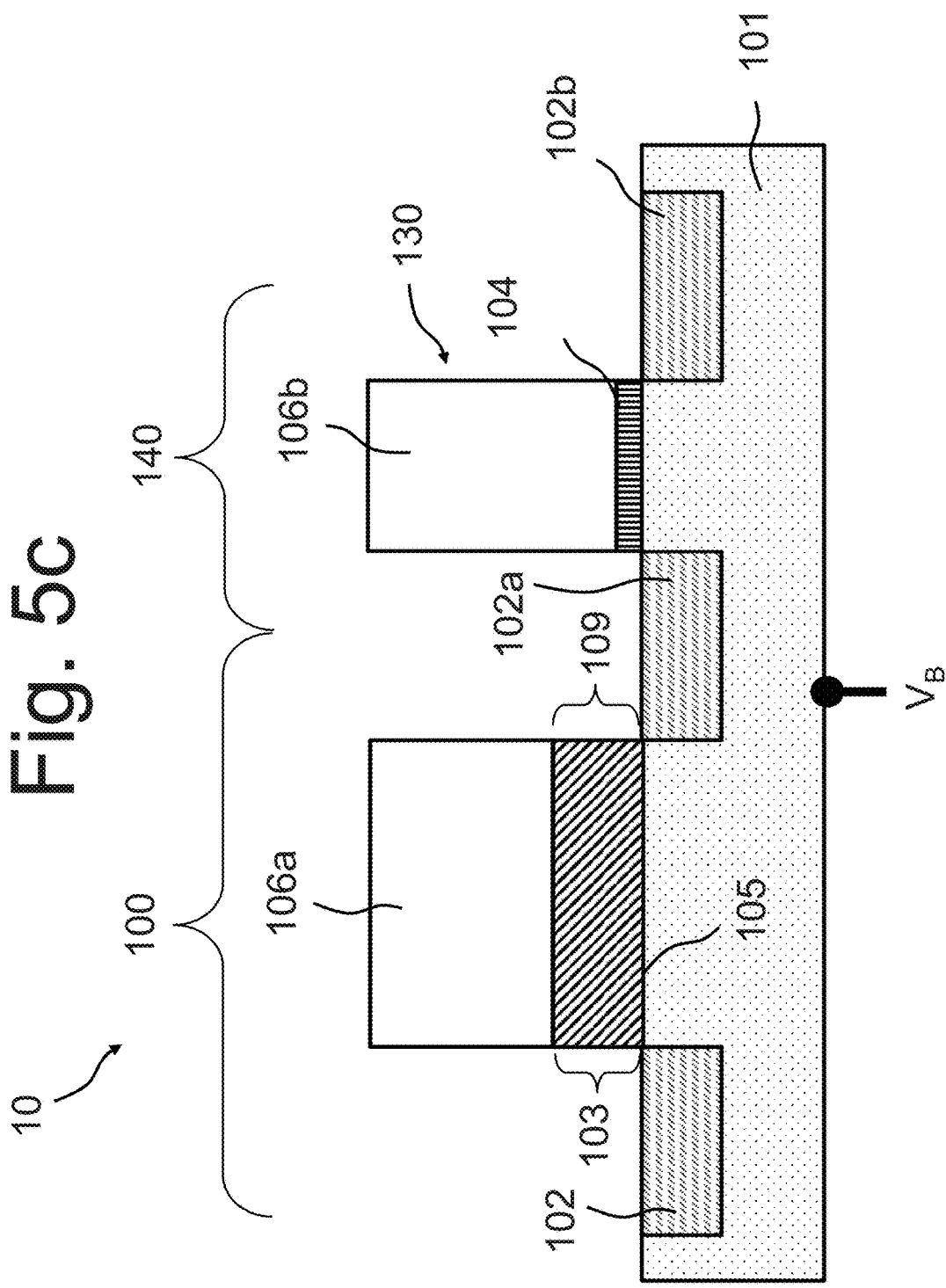

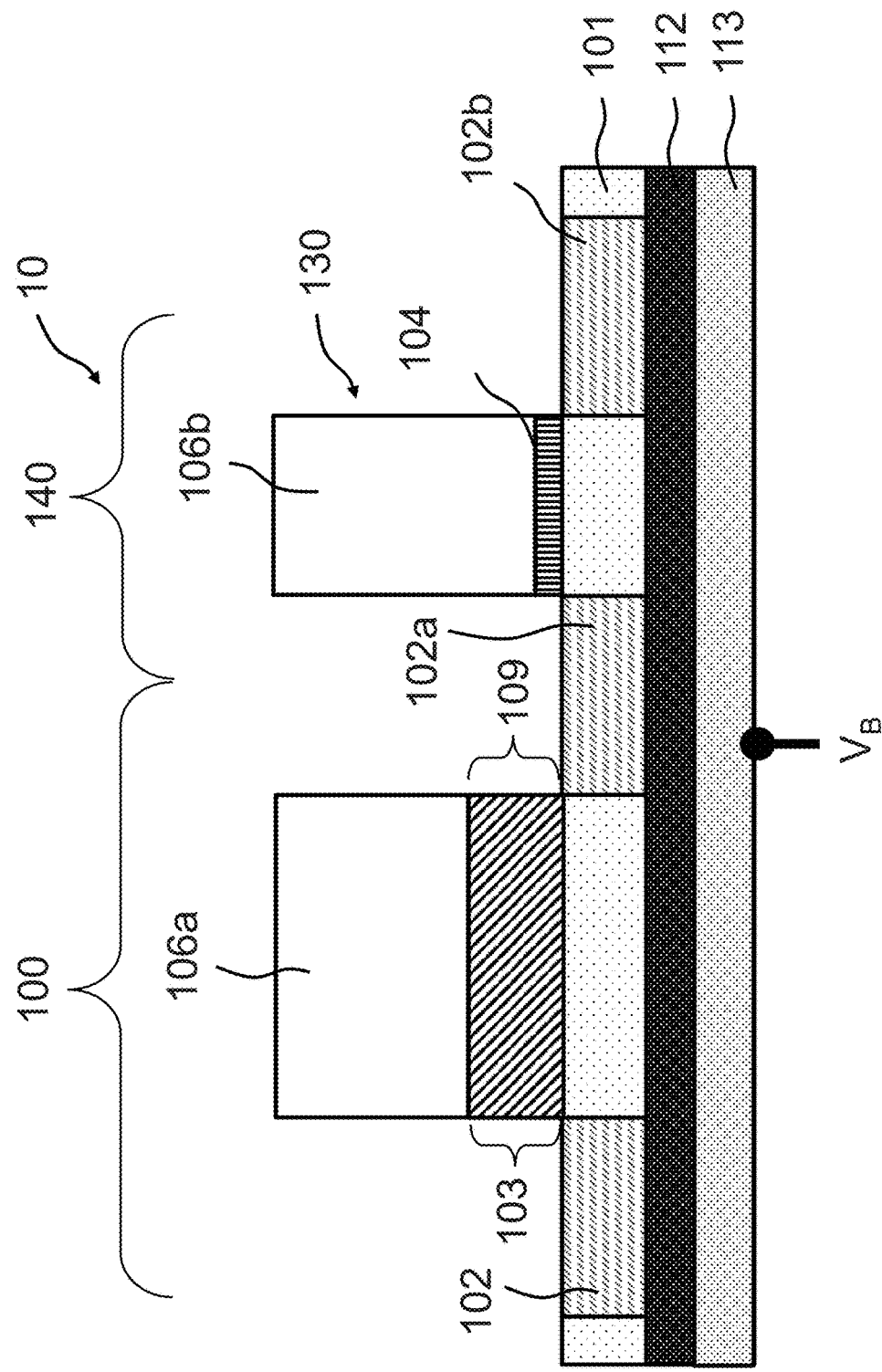

1

POLARIZATION-BASED CONFIGURABLE LOGIC GATE

BACKGROUND

Many electronic devices and systems have the capability to store and retrieve information in a memory structure. In the von Neumann architecture which is typically used in modern electronic devices information is processed in a central processing unit (CPU) while information is stored in a separate memory. Thus the information has to be transmitted between CPU and memory for processing and storing. Schematically this is depicted in FIG. 1a for an integrated circuit 20 where data is transferred between a CPU and separate memories (SRAM and eNVM). For high speed processing, such information transfer represents a bottleneck called the "von Neumann bottleneck", which has a negative impact on processing speeds of devices. The temporary storage of information and the random accessing of information become more important as storage technologies interface more directly with the processor of an electronic system. To reduce the effort in terms of power consumption and information transmission time, there is a need for innovative combinations of new devices and architectures which could extend the current CMOS technology by providing new information processing platforms. "Logic in Memory" (LiM) and neuromorphic circuits address the von-Neumann architecture bottleneck by reducing the transit times of information due to the use of the non-volatile memory (NVM) elements for information processing and fine-grained implementation of logic circuits directly with memory elements in the processing unit. A number of different non-volatile memory devices have been demonstrated in such concepts, including Flash, resistive RAMs (ReRAM), magnetoresistive RAM (MRAM), and phase change memory (PCM).

With regard to ferroelectric (FE) structures, non-volatile memory (NVM) elements can be realized as capacitor type (e.g., a FeRAM) or transistor type (FeFET) solutions, where information can be stored as a certain polarization state of a ferroelectric material layer within the structure. The ferroelectric material used is hafnium dioxide ($HfO_2$) or zirconium dioxide or a solid solution of both transition metal oxides. In the case of pure hafnium oxide, the remnant polarization can be improved by adding a dopant species incorporated into the $HfO_2$ layer during the deposition.

The ferroelectric material is intended to partially or fully replace the gate oxide of a transistor or the dielectric of a capacitor. Switching is caused by applying an electrical field via a voltage between the transistor gate and transistor channel. Specially, for n-channel transistors, ferroelectric switching after applying a sufficiently high positive voltage pulse causes a shift of the threshold voltage to lower or negative threshold voltage values. For p-channel transistors a negative voltage pulse causes a shift of the threshold voltage to more positive threshold voltage values.

FeFET memory devices have advantages over other types of non-volatile storage devices. Generally FeFET memory devices offer faster sensing and programming access times and lower power consumption during programming operation due to the specific physical storage mechanism. Further, FeFET memory devices are easier to integrate into High-k metal gate CMOS technology since the materials employed for FeFET memory devices are already used as gate oxide or DRAM dielectric materials. These advantages, and others, may explain the increasing popularity of FeFET memories for embedded storage as well as for stand-alone applications to be adopted in devices such as memory cards, USB flash drives, mobile phones, digital cameras, mass storage devices, MP3 players and the like.

SUMMARY

According to one example, a polarization-based logic gate includes a transistor having a drain and a polarizable material layer having a polarization state settable to any polarization state from among at least two polarization states, the polarization state to which the polarizable material layer is set representing a first logic value, and a resistive element having a first terminal coupled to the drain and a second terminal. A plurality of input/output terminals connected to the transistor and second terminal of the resistive element so as to apply voltages to selected input/output terminals, including a sensing voltage representing a second logic value, with a resulting drain current of the transistor at least partially flowing through the resistive element and representing a result of a logic operation between the first logic value and the second logic value.

In accordance with examples described herein, an integrated circuit comprises a ferroelectric logic gate including a layer of ferroelectric material. The polarization state of the ferroelectric material can be reversed by applying voltages to the structure which are higher than the coercive voltage of a layer of ferroelectric material. Thus the polarization state of the ferroelectric material can be any one among at least two different logic states used to store at least one binary logic value or bit in the polarizable material layer.

When applying a voltage as input signal to the ferroelectric logic gate the output signal is switched depending on the first logic state stored internally in the ferroelectric logic gate by the polarization of the layer of ferroelectric material and the applied input signal. The output of the ferroelectric logic gate depends on first stored logic state and the input signal, which is referred to as the second applied logic state, both combined forming one logic operation.

When a resistive element is added such that it is connected to drain contact of the transistor (100 FIG. 1c) the resulting drain current can be converted into a voltage signal as output signal and the output impedance of the circuit can be adjusted to match the needs for the next stage of a cascaded logic circuit.

Specifically in the case of the existence of multiple polarization states in one FeFET 100 and in accordance with an embodiments described herein a multitude of voltage pulses might be applied to the ferroelectric logic gate to partially reverse the polarization state of the FeFET. Thus a multitude of intermediate threshold voltage levels and corresponding signal transmissivity can be attained. In this way the ferroelectric logic gate can be adopted to realize a synaptic circuit.

BRIEF DESCRIPTION OF THE DRAWINGS

FIG. 1a is a block and schematic diagram generally illustrating an example of a conventional computing system.

FIG. 1b is a block and schematic diagram generally illustrating a computing system employing polarization based logic gates, according to one example.

FIG. 1c is a schematic diagram generally illustrating a polarization-based logic gate, according to one example.

FIG. 3d is a table summarizing example operation voltages for programming and sensing operations for performing NOR/NAND logic operations illustrated by the voltage-time diagram of FIG. 3c.

FIG. 5a is a cross-sectional view illustrating a ferroelectric logic gate including a FeFET transistor and a resistive element, according to one example.

FIG. 5b is a cross-sectional view illustrating a ferroelectric logic gate including a FeFET transistor on a SOI substrate and a resistive element, according to one example.

FIG. 5c is a cross-sectional view illustrating a ferroelectric logic gate including a FeFET transistor and a resistive element, where the resistive element is realized as a field effect transistor, according to one example.

FIG. 5d is a cross-sectional view illustrating a ferroelectric logic gate including a FeFET transistor on a SOI substrate and a resistive element, where the resistive element is realized as a field effect transistor, according to one example.

DETAILED DESCRIPTION

Figure 2A:
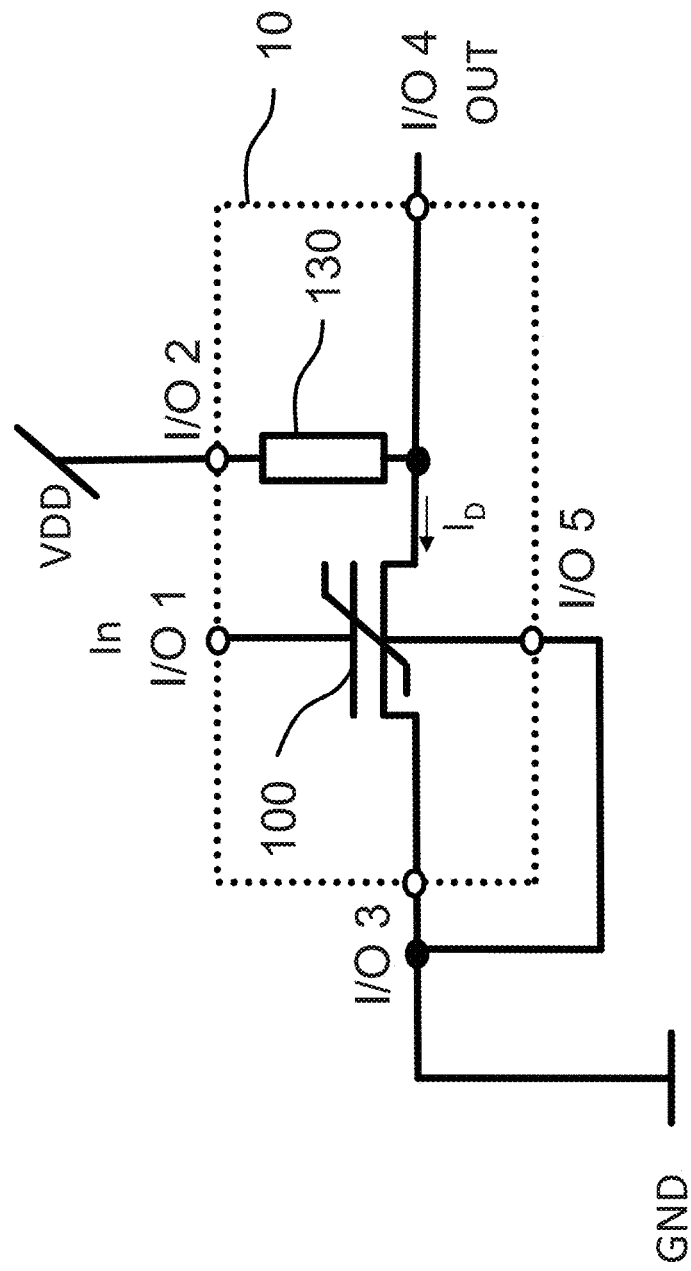
FIG. 2a is a schematic of polarization-based logic gate, according to one example.

In order to reduce the effort in terms of power consumption and information transmission time caused by the von Neumann bottleneck, there is a need for innovative approaches to devices and architectures which are able to extend current CMOS technology and potentially provide new information processing platforms. "Logic in Memory" (LiM) and neuromorphic circuits address the von-Neumann bottleneck by reducing transit times of information transfer through use of the non-volatile memory (NVM) elements for information processing and fine-grained implementation of logic circuits directly with memory elements in a processing unit.

FIG. 1b is a schematic diagram generally illustrating a fine-grained logic-in-memory system (LiM) 30 having a processing unit (PU) including logic gates 10, according to one example of the present disclosure, employing a polarizable material layer controllable to be set to any one of at least two polarization states, such as a ferroelectric material layer, for instance. Logic gates 10, as will be explained in greater detail below, may be referred to herein as polarization-based configurable logic gates 10, or simply polarizable logic gates 10. As illustrated in one example, polarizable logic gates 10 may be directly integrated into the PU in a way that information processing and information storage are performed within the same LiM circuit. In this way, information transmission between the PU and a separate memory array may be avoided, thereby addressing the von Neumann bottleneck.

In accordance with examples which will be described herein, a polarizable logic gate 10 has a structure including a polarizable device having a layer of polarizable material. In one example, as will be described below, the polarizable device is a FeFET having a layer of ferroelectric material, where a polarization state of the ferroelectric material of the FeFET can be reversed by applying voltages to the to a terminal structure of logic gate 10 which are higher than a coercive voltage of the ferroelectric material layer. In this way, the polarization state of the ferroelectric material layer of the FeFET can be used to store information represented by one of a minimum of two logic states. Although described herein primarily in terms of a FeFET having a ferroelectric material layer, as mentioned above, logic gates 10 may employ polarizable devices other than FeFETs, where a polarization state of a polarizable material of such other devices may be controlled to represent at least two logic states.

In one example, as will be described in greater detail below, when applying a voltage as an input signal to logic gate 10, an output signal of logic gate 10 is output having a value depending on a first logic value stored within logic gate 10 as the polarization state of the ferroelectric material layer of the FeFET, and on a second logic value represented by the input signal applied to logic gate 10. The logic value represented by the polarization state of the polarizable device, such as the polarization state of the ferroelectric material layer of the FeFET, is referred to herein as the first logic value (but may also sometimes be referred to as "the stored first logic value" or "the first logic state"). The logic value represented by the applied input signal is referred to herein as the second logic value (but may also sometimes referred to as "the applied second logic value" or "the second logic state"). An applied voltage representing the second logic value might be lower than a voltage level required to switch the polarization state of the ferroelectric material layer of the FeFET (or other polarizable device).

In one example, the layer of ferroelectric material might be realized in a MFM (metal-ferroelectric-metal) or MFS (metal-ferroelectric-semiconductor) structure forming a ferroelectric capacitor.

In another example, the layer of ferroelectric material might be formed in a MFS or MFMIS (metal-ferroelectric-insulator-semiconductor) structure being part of a ferroelectric field effect transistor (FeFET).

With reference to FIG. 1c, in one example, ferroelectric logic gate structure 10 may be formed, e.g., as a metal ferroelectric semiconductor (MFS) structure, such as a FeFET 100 in combination with a resistive element 130. According to such implementation, ferroelectric logic gate 10 includes five input/output (I/O) channels or terminals, illustrated as terminals I/O 1 to I/O 5, where terminal I/O 3 is a first source/drain terminal, terminal I/O 1 is a gate terminal, terminal I/O 5 is a bulk terminal, terminal I/O 4 is a second source/drain terminal of FeFET 100, and terminal I/O 2 is a first terminal of resistive element 130. A second terminal of resistive element 130 is connected to the second source/drain terminal I/O 4 of the FeFET 100.

With resistive element 130 connected to the drain contact I/O 4 of transistor 100 (e.g., FeFET 100), a resulting drain current can be converted into an output voltage signal and an output impedance of the logic gate 10 can be adjusted to match the needs for a next stage of a cascaded logic circuit.

Resistive element 130 may be realized as an ohmic resistor, a diode, as anti-parallel connected diodes, as a load transistor of either polarity (NFET or PFET), or any other suitable combination of electronic elements which are suitable to provide a current dependent voltage drop.

An example of the operation of logic gate 10 can be described as follows. In a first step, the first logic value is written (or programmed) to the ferroelectric material layer of the transistor (e.g., transistor 100) of logic gate 10 by applying voltages to the five terminals I/O 1-5 which are suitable to adjust the threshold voltage of the FeFET device 100. For example, a logic "1" can be stored in FeFET device 100 as a low threshold voltage level ("low-VT" state), whereas a logic "0" can be stored as higher threshold voltage ("high-VT" state). As described above, this is referred to as the first logic value (or first logic state).

An example of such a programming operation includes applying a voltage pulse to terminal I/O 1 (i.e. with reference to FIG. 5a, to the gate electrode 106 of the ferroelectric logic gate 10 to change a direction of electric polarization of ferroelectric layer stack 109, herein indicated as polarization of a portion or of the totality of ferroelectric domains within the ferroelectric material).

In a second step, the second logic value is applied as an input signal to ferroelectric logic gate 10. In one example, the applied input signal is a voltage pulse applied to terminal I/O 1 (i.e., to gate electrode 106, see FIG. 5a) of ferroelectric logic gate 10 to change conductivity of a channel of FeFET 100. For example, a high voltage representing a logic "1" or a lower voltage representing a logical "0" can be applied to the gate electrode 106. As described above, this is referred to as the second logic value (or second logic state). As will be described in greater detail, an output of ferroelectric logic gate 10 depends on the stored first logic value and on the applied second logic value, such that the first step and the second step together form one logic operation.

The applied input signal representing the second logic value, the gate voltage $V_G$, source voltage $V_S$, drain voltage $V_D$ and bulk voltage VB should be in a range where the drain current of the transistor 100 is not in a saturated state and thus is sensitive to the applied second logic value and the threshold voltage (VT) of transistor 100.

With reference to FIG. 2a, according to one example, FeFET 100 can represent a NMOS FeFET 100, where an operation voltage VDD is applied to terminal I/O 2 (i.e., the first terminal of resistive element 130) while terminals I/O 3 and I/O 5 are grounded. As will be described below, according to such arrangement, polarization-based logic gate 10 is configured to provide logic AND and logic NAND operations. By applying a positive programming voltage pulse representing a first logic value having a value of "1" to terminal I/O 1 (which is connected to the gate of FeFET 100), the threshold voltage of FeFET 100 can be altered to produce a "low-VT" state if the applied voltage pulse produces an electrical field in the ferroelectric material of FeFET 100 which exceeds a coercive field of the ferroelectric material. Similarly, by applying a negative programming voltage pulse representing a first logic value having a value of "0" to terminal I/O 1, the threshold voltage of FeFET 100 can be altered to produce a "high-VT" state if the applied voltage pulse produces an electrical field in the ferroelectric material of FeFET 100 which exceeds the coercive field of the ferroelectric material. In a second step, after application of the programming voltage pulse to terminal I/O 1 to program or write a stored first logic value to FeFET 100 (e.g. a logic value of "1" or "0"), a sensing voltage is applied to the terminal I/O 1, where a resulting voltage at terminal I/O 4 depends on the stored first logic value (which is represented as threshold voltage, VT, of FeFET 100) and on the second logic value (which is represented by the sensing voltage applied to the gate of FeFET 100; i.e., terminal I/O 1 of logic gate 10).

Figure 2B:
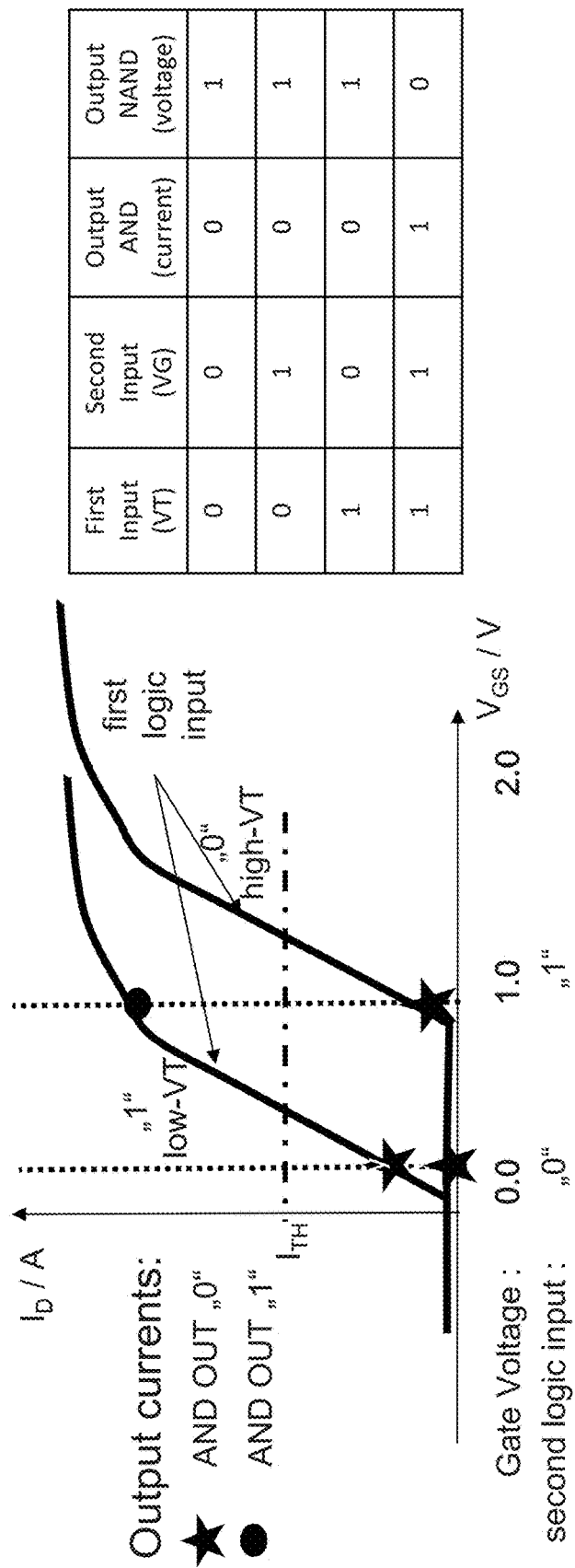
FIG. 2b is a drain current versus gate voltage diagram illustrating operation of the polarization-based logic gate of FIG. 2a configured to provide AND (NAND) logic operation, according to one example.

With reference to the drain current vs. gate voltage diagram in FIG. 2b, a high threshold voltage "high-VT" of FeFET 100, representing a stored first logic value "0", in combination with either a lower applied gate voltage of 0V representing a second logic value "0" or a higher applied gate voltage of 1V representing a second logic value "1" will result in a very low drain current flow as indicated by the two left-most stars in the I-V curves of FIG. 2b. Moreover, a low threshold voltage "low-VT" of the FeFET, representing a stored first logic value "1", in combination with a lower applied gate voltage of 0V representing a second logic value "0" will also result in a low drain current flow as indicated by the right-most star in the I-V curves of FIG. 2b. Only in a case of a low threshold voltage "low-VT" of FeFET 100, representing a stored first logic value "1", in combination with a higher applied gate voltage of 1V, representing a second logic value "1", will a significant drain current flow as indicated by the black dot in the I-V curves of FIG. 2b. In view of the above, with respect to the drain current as output variable, where a low current represents a logic "0" and a higher current represents a logic "1", a logic AND operation is provided. Additionally, with respect to a voltage at output terminal I/O 4 as an output variable, where a low voltage represents a logic "0" and high voltage represents a logic "1", a logic NAND operation is provided.

It is to be understood that the IV-characteristics depicted in FIG. 2b, including the voltage values indicated, are provided for illustrative purposes only to illustrate an example of operation principles of ferroelectric logic gate 100.

With reference to FIG. 2a, in one example, with FeFET 100 programmed to have a high threshold voltage ("high-VT") value of about 1.0V (representing a stored first logic value of "0") in combination with either a lower applied gate voltage of 0.1V representing a second logic value of "0" or a higher applied gate voltage of 0.7V (representing a second logic value of "1") results in a very low current flow of less than 2E-6 A. Additionally, with FeFET 100 programmed to have a low threshold voltage ("low-VT") value of about 0.4V (representing a stored first logic value of "1") in combination with a lower applied gate voltage value of 0V (representing a second logic value "0") also results in a very low current flow of less than 2e-6 A. Only in a case of FeFET 100 being programmed with a low threshold voltage ("low-VT") value of about 0.4V (representing a stored first logic value of "1") in combination with a higher applied gate voltage value of 0.7V (representing a second logic value of "1") will a significant drain current of about 1E-5 A flow. In that way, with respect to the drain current as an output variable, where a smaller current of less than about 4E-6 A represents a logic "0" and a higher current larger than about 4e-6 A represents a logic "1", a logic AND operation is realized.

With continued reference to FIG. 2A, in example, when connecting a 100 kOhm resistor as resistive element 130 to the drain terminal of FeFET 100 (terminal I/O 4) and applying an operation voltage VDD having a value of 1.4V to resistor 130, programming FeFET 100 to have a high threshold voltage ("high-VT") having a value of about 1.0V (representing a stored first logic value of "0") in combination with either a lower applied gate voltage having a value of 0.1V (representing a second logic value of "0") or a higher applied gate voltage having a value of 0.7V (representing a second logic value of "1") results in a high output voltage of about 1.2V at terminal I/O 4. Additionally, programming FeFET 100 to have a low threshold voltage ("low-VT") having a value of about 0.4V (representing a stored first logic value of "1") in combination with a lower applied gate voltage having a value of 0V (representing a second logic value of "0") also results in a high output voltage having a value of about 1.2V at terminal I/O 4 (the drain terminal of FeFET 100). Only when FeFET 100 is programmed to have a low threshold voltage ("low-VT") value of about 0.4V (representing a stored first logic value of "1") in combination with a higher applied gate voltage have a value of 0.7V (representing a second logic value of "1") will a low output voltage having a value of about 0.2V result at terminal I/O 4. In that way, with respect to the drain voltage at terminal I/O 4 as an output variable, where a smaller voltage of less than about 0.6V represents a logic "0" and a higher voltage larger than about 0.6V represents a logic "1", a logic NAND operation is realized.

Figure 3A:
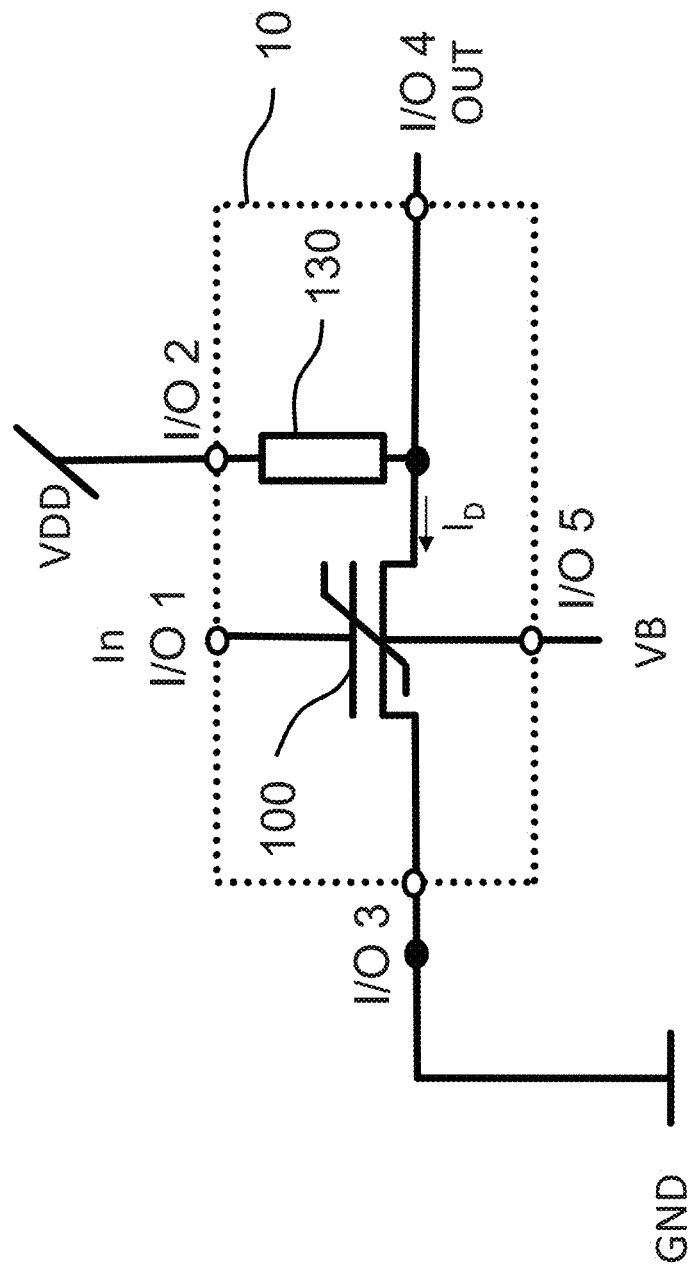
FIG. 3a is a schematic diagram generally illustrating a polarization-based logic gate, according to one example.

Referring to FIG. 3a, according to one example, an operation voltage VDD may be applied to terminal I/O 2 while terminal I/O 3 is grounded. In a first step, by applying a programming voltage pulse, representing a first logic value, to terminal I/O 1, which is connected to the gate of FeFET 100, the threshold voltage (VT) of FeFET 100 can be altered if the applied programming voltage pulse causes an electrical field in the ferroelectric material layer (e.g., layer 109 in FIG. 5a) that exceeds a coercive field of the ferroelectric material. In a second step, a sensing voltage is applied to terminal I/O 1 (the gate of FeFET 100). Moreover, a back bias voltage, VB, is applied to terminal I/O 5 which results in an additional shift in the threshold voltage, VT, of FeFET 100. According to such arrangement, a resulting voltage at terminal I/O 4 depends on the stored first logic value (represented by the threshold voltage, VT, of FeFET 100) and the second logic value, which is applied as a gate voltage to terminal I/O 1 (the gate of FeFET 100) and on the back bias voltage, VB, applied to terminal I/O 5.

Figure 3B:
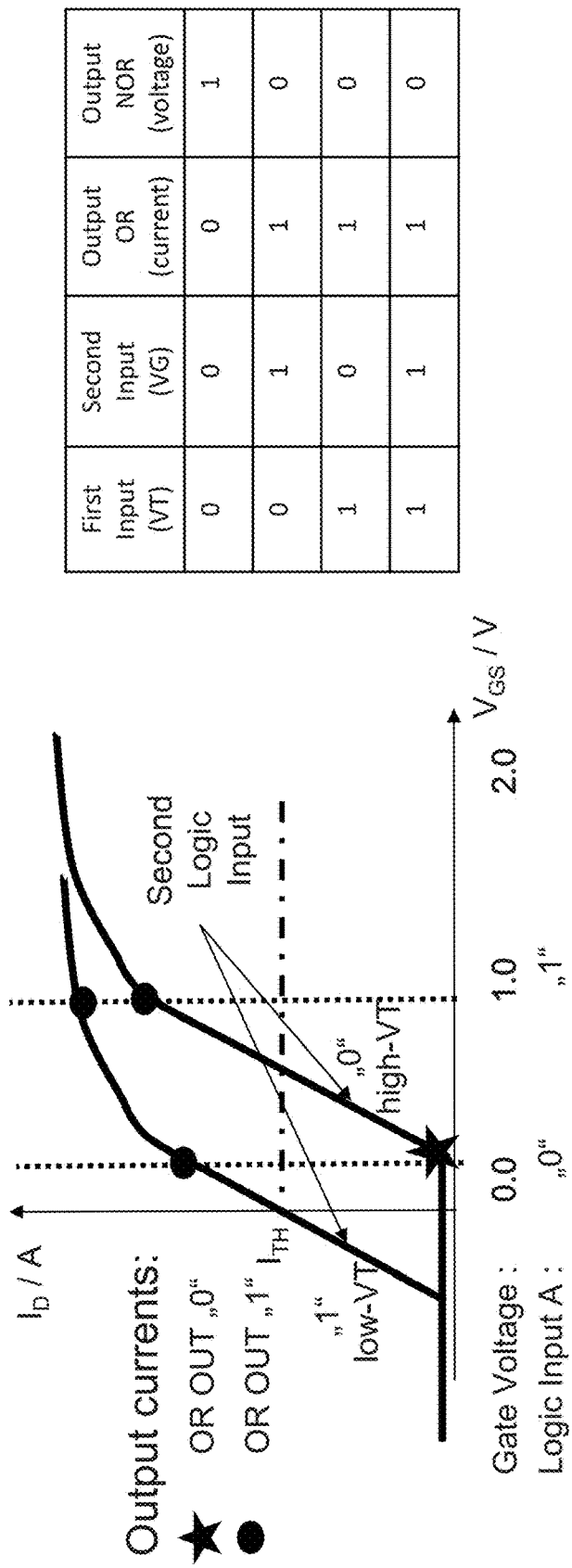
FIG. 3b is a drain current versus gate voltage diagram illustrating operation of the polarization-based logic gate of FIG. 3a configured to provide OR (NOR) logic operation, according to one example.

FIG. 3b is a drain current vs. gate voltage diagram representing an example of the operation of the polarization-based logic gate 10 of FIG. 3a. As illustrated, programming FeFET 100 with a high threshold voltage ("high-VT"), representing a stored first logic value of "0", in combination with a lower applied gate voltage of 0V, representing a second logic value of "0", results in a very low drain current flow, as indicated by the black star in the I-V curve of FIG. 3b. With all other combinations, namely a high threshold voltage "high-VT", representing a first stored logic value "0", in combination with higher applied gate voltage of 1V, representing a second logic value "1", or a low threshold voltage "low-VT", representing a stored first logic value "1", in combination with either an applied gate voltage of 0V or 1V, representing a second logic value of "0" or "1", will result in a significantly larger drain current flow as indicated by the black dots in the I-V curve of FIG. 3b. In that way, with respect to the drain current as an output variable, where a low current represents a logic "0" and a significant higher current represents a logic "1", a logic OR operation is realized. Additionally, referring to FIG. 3a, with a voltage at output terminal I/O 4 as an output variable, where a low voltage represents a logic "0" and high voltage represents a logic "1", a logic NOR operation is realized.

It is to be understood that by adjusting the back bias voltage of the FeFET 100 at terminal I/O 5 of polarization-based logic gate 10, the threshold voltage of FeFET 100, both "low-VT" and "high-VT", can be shifted simultaneously. Moreover, by adjusting the source voltage applied to the source of FeFET 100 at terminal I/O 3 of polarization-based logic gate 10 to a non-zero value (i.e.; a voltage unequal to 0V), the drain current vs. gate voltage characteristic of FeFET 100 can be shifted relative to the gate voltage. Further, by adjusting the sensing voltage representing the second logic value that is applied to the gate of the FeFET 100 at terminal I/O 1 of polarization-based logic gate 10, an operation point as indicated by the vertical dotted lines in FIGS. 2b and 3b can be shifted relative to the drain current vs. gate voltage characteristic of FeFET 100. In that way, it is possible to change the logic operation performed by polarization-based logic gate 10 between NAND and NOR or AND and OR operation, respectively.

Figure 3C:
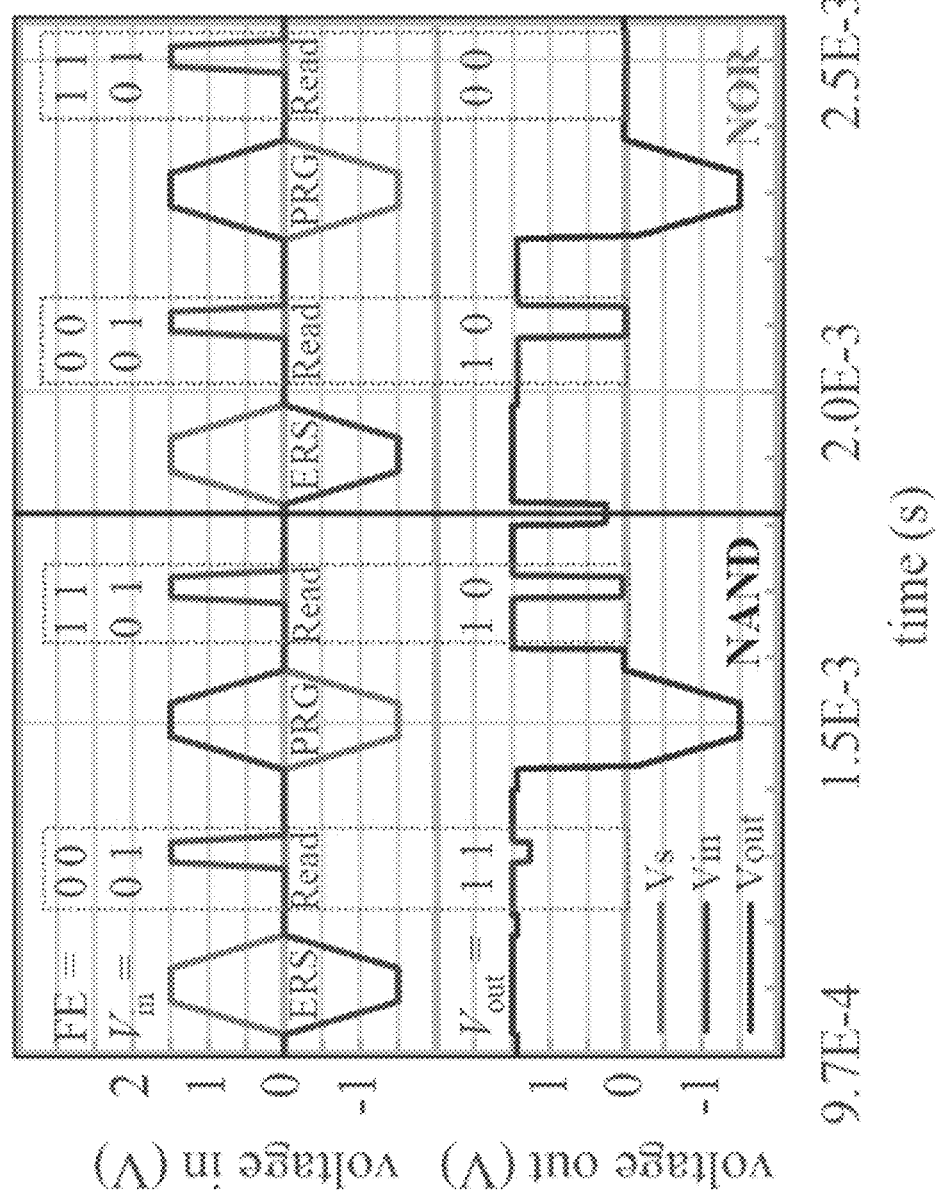
FIG. 3c is a voltage-time diagram illustrating NOR/NAND logic operation of the polarization-based logic gate, according to one example.

FIG. 3c is a voltage-time diagram illustrating an example of an operation scheme of polarization-based logic gate 10 where the logic operation is switched between NAND and NOR operation by adjusting the back bias voltage (where a shift in back bias voltage is indicated by the heavy vertical line in FIG. 3c). FIG. 3d is a table summarizing the corresponding operation voltages for programming and sensing operations as performed in step 1 and step 2 of a logic operation, respectively. With reference to FIG. 3d, it is noted that Vg, Vs and Vbb denote voltages applied to gate, source and back gate, respectively. Vgs denotes a resulting voltage difference between gate and source. First and second logical inputs are represented by the internal polarization state of the FeFET and the applied gate voltage Vg, respectively. Vout denotes the output voltage representing the result of the logic operation.

It is to be understood that operation of the polarization-based logic scheme of the present disclosure is not limited to the example operation schemes described herein. Moreover, it is to be understood that if corresponding threshold voltages exhibit different absolute values, which can originate from different work-functions of the electrodes 106 (see FIGS. 5-6) or a different absolute remnant polarization of the ferroelectric material, the operation voltages and specifically the applied gate voltage representing the second logic value can differ from the exemplarily given values and might be adjusted to optimize the operation of polarization-based logic gate 10.

It is to be understood that by adjusting combinations of suitable signals applied to the polarization-based logic gate 10 other logic operations may be realized.

It is to be understood that a single logic operation might include more than one programming step and one sensing step. For example, a multitude of programming and sensing steps might define one logic operation. Specifically, in the case of the existence of multiple polarization states (more than two) in a single FeFET, more than one bit of information might be stored and processed within a single ferroelectric logic gate. In one example, in order to access intermediate threshold voltage levels, a multitude of programming pulses with different amplitudes, polarities or pulse width might be applied subsequently.

Moreover, it is to be understood that for consecutive logic operations which are performed with a single ferroelectric logic gate, a programming step and a sensing step can be combined in a way that the sensing step of a first logic operation and the programming operation of a second logic operation are combined within one step. In other words, the sensing step of a first logic operation might alter the threshold voltage of the FeFET device in a way that the stored first logical value is altered by that sensing step.

Figure 4:
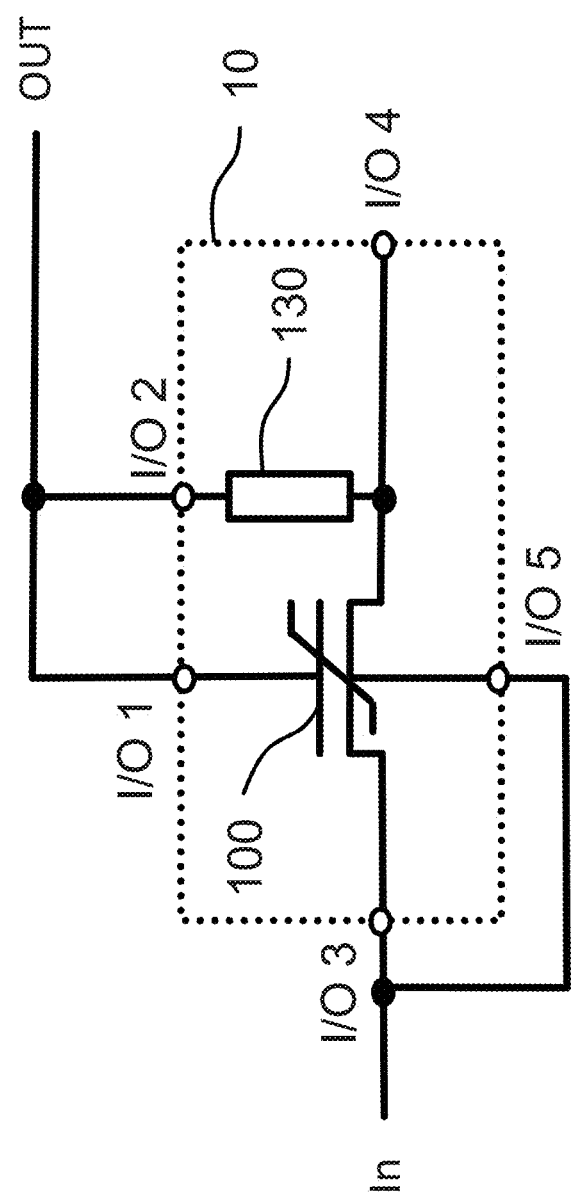
FIG. 4 is a schematic diagram illustrating an example of a ferroelectric logic gate configured to form a two terminal synaptic circuit.

With reference to FIG. 4, in one example implementation, terminals I/O 3 and I/O 5 of polarization-based logic gate 10 are connected to form an "In" terminal, and terminals I/O 1 and I/O 2 are connected to form an "Out" of a two terminal circuit, while terminal I/O 4 is left unconnected (or floating). In one example, threshold voltage, VT, of FeFET 100 can be altered in a programming step by applying suitable voltage pulses to the two terminals "In" and "Out" if the applied voltage exceeds the coercive voltage of FeFET 100. Moreover, by applying voltage pulses to both terminals "In" and "Out" in a sensing operation, a signal in the form of a current flow, which depends on the threshold voltage of the FeFET, can be transmitted between the "In" and "Out" terminals. It is to be understood that both transmission of a signal and alteration of threshold voltage can be performed in separate steps or can be combined in a single step. Specifically, in the case of the existence of multiple polarization states in FeFET 100, a multitude of voltage pulses might be applied to the ferroelectric logic gate to partially reverse the polarization state of the FeFET. Thus a multitude of intermediate threshold voltage levels and corresponding signal transmissivity can be attained. In that way the ferroelectric logic gate can be adopted to realize a synaptic circuit.

Resistive element 130 causes a drain current dependent voltage drop between the gate electrode of FeFET 100 that is connected to terminal I/O 1 of the ferroelectric logic gate 10 and the second Source/Drain terminal of FeFET 100 that is connected to terminal I/O 4. More specifically, when applying a suitable programming voltage between the "In" and "Out" terminals in order to change the internal polarization state of the ferroelectric logic gate, a drain current will flow through resistive element 130. A current dependent voltage drop will result in a potential difference between the gate of the FeFET and the second Source/Drain region. Thereby the formation of a suitable electrical field over the ferroelectric layer stack 109 can be attained during program operation.

It is noted that selection and design of resistive element 130 enables tuning of the programming and signal transmission properties of ferroelectric logic gate 10 in the two terminal configuration of FIG. 4.

According to one illustrative example, resistive element 130 of polarization-based logic gate 10 is implemented as a 100 kOhm resistor. The threshold voltage of the FeFET 100 can be altered in a programming step by applying suitable voltage pulses of about 3V amplitude and a pulse duration of about 1 microsecond to the two terminals "In" and "Out". Moreover, subsequently applying voltage pulses of about 2V amplitude and a pulse duration of about 1 microsecond at both terminals "In" and "Out" in a sensing operation, a signal in the form of a current flow of 2E-5 A for a high threshold voltage of about 0.35V of FeFET 100, or in another example a signal in the form of a current flow of 6E-5 A for a low threshold voltage of about 0.2V of FeFET 100 is transmitted between first and second terminals "In" and "Out". It is to be understood that both transmission of a signal and alteration of threshold voltage can be performed in separate steps or can be combined in a single step for example by applying voltage pulses with an amplitude of 2.5V and a pulse duration of 1 microsecond. Specifically in the case of the existence of multiple polarization states in one FeFET 100 a multitude of voltage pulses with an amplitude of 2.5V and a pulse duration of 1 microsecond might be applied to the logic gate 10 to partially reverse the polarization state of FeFET 100. Thus a multitude of intermediate threshold voltage levels and corresponding signal transmissivity can be attained. In this way, polarization-based logic gate 10 can be adopted to realize a synaptic circuit.

Although specific examples have been illustrated and described herein, it will be appreciated by those of ordinary skilled in the art that a variety of alternate and/or equivalent implementations may be substituted for the specific examples shown and described without departing from the scope of the present disclosure. This application is intended to cover any adaptions or variations of the specific examples discussed herein. Therefore, it is the intention of this disclosure being limited only by the claims and the equivalents thereof.

FIG. 5*a* is a cross-sectional view of an example of a MFS structure 100 including a support structure 101 comprising a carrier material, such as a silicon compound. An interfacial layer 105 can be formed over layer 101, which can comprise any suitable material(s) including, without limitation, $SiO_2$ or SiON or any other silicon containing material. A layer of ferroelectric material 103 is formed over layer 105 or directly over layer 101.

The term "ferroelectric material," as used herein, refers to a material that is at least partially in a ferroelectric state. For example, the ferroelectric material in layer 103 may comprise as a main component any materials including of $HfO_2$, $ZrO_2$, any ratio of Hf and Zr combined with oxygen (e.g., $Zr_xHf_{1-x}O_2$, where x<1) as well as any combinations thereof. In addition, the term "main components", as used herein, refers to any suitable number of O and any one or combinations of Hf, Zr and (Hf, Zr) per volumetric content, e.g. unit cell, that is higher compared to any other components or further additives introduced in any suitable manner into a ferroelectric material oxide layer.

The layer of ferroelectric material can comprise more than one different ferroelectric domains 103*a*, 103*b* and 103*c*, which can coincide with different grains in a polycrystalline film. Each of the domains can comprise a different coercive voltage, originating from a different crystal orientation of the individual grain, a different internal stress, a different surface energy due to different grain sizes or different doping concentration, or other differences in the physical or chemical composition.

The layer of ferroelectric material 103—and if existing—together with the interfacial layer 105 forms a layer stack 109. In one example described herein the layer stack 109 represents a storage layer of a ferroelectric logic gate.

Conductive layer 106 can comprise any one or more suitable conductive metals including, without limitation, Ti, TiN, TiSi, TiAlN, TaN, TaCN, TaSi, W, WSi, WN, Ru, RuO, Re, Pt, Ir, IrO, Ti, Ni, NiSi, Nb, Ga, GaN, C, Ge, Si, SiC oder GeSi. It is to be understood, that the material of the conductive layer can be chosen such that the work-function of the respective material influences the coercive voltage of the adjacent layer of ferroelectric material in a manner that is beneficial for the operation of the ferroelectric memory cell.

The conductive layer 106 can be formed utilizing any one of atomic layer deposition (ALD), metal organic atomic layer deposition (MOALD), chemical vapor deposition (CVD), metal organic chemical vapor deposition (MOCVD), physical vapor deposition (PVD), molecular beam epitaxy (MBE) deposition, Sol-gel or any other suitable deposition technique that facilitates formation of the layer. The thickness of conductive layer 106 can be in the range of 1 nm to 10 nm or 1 nm to 300 nm.

An example process for forming the MFS structure of FIG. 5*a* is described as follows. A carrier structure 101 is provided that may comprise a Si (silicon) compound, such as SiGe (silicon-germanium). It is noted that other semiconductor materials can also be provided as the carrier structure 101 including, e.g., III-V semiconductor compounds such as GaAs or any other suitable substrate material. The carrier structure 101 may have already been processed so as to include components and/or other devices already be formed within the carrier structure.

An interfacial layer 105 can be formed on the support structure 101 to improve the transistor channel to gate oxide interface quality, to reduce the number of charge traps or to prevent chemical reactions between the support structure 101 and the layer of ferroelectric material 103.

Referring to the cross-sectional view of FIG. 5a, in another example, a conductive layer 111 can be formed between an interfacial layer 105 and the ferroelectric material layer 103. The conductive layer 111 can comprise any one or more suitable conductive metals including, without limitation, Ti, TiN, TiSi, TiAlN, TaN, TaCN, TaSi, W, WSi, WN, Ru, RuO, Re, Pt, Ir, IrO, Ti, Ni, NiSi, Nb, Ga, GaN, C, Ge, Si, SiC oder GeSi. The conductive layer 111 can be formed utilizing any one of atomic layer deposition (ALD), metal organic atomic layer deposition (MOALD), chemical vapor deposition (CVD), metal organic chemical vapor deposition (MOCVD), physical vapor deposition (PVD), molecular beam epitaxy (MBE) deposition, Sol-gel or any other suitable deposition technique that facilitates formation of the layer. The thickness of conductive layer 111 can be in the range of 0.1 nm to 10 nm or 1 nm to 300 nm.

The layer of ferroelectric material 103 is formed on the interfacial layer 105 or directly on the support structure 101 for the MFS structure 100 of FIG. 5a or is formed on the conductive layer 111. The ferroelectric layer 103 and the interfacial layer, if available, and the conductive layer 111, if available, form the layer stack 109. In each embodiment, layer 103 can be formed utilizing any one of atomic layer deposition (ALD), metal organic atomic layer deposition (MOALD), chemical vapor deposition (CVD), metal organic chemical vapor deposition (MOCVD), physical vapor deposition (PVD), molecular beam epitaxy (MBE) deposition, Sol-gel or any other suitable deposition technique that facilitates formation of the layer including the ferroelectric material as described herein (i.e., oxygen and at least one of Hf and Zr), where growth of the layer can be poly-crystalline. Any suitable number and types of precursors may be utilized to introduce elements such as Hf and Zr into the layer 103 utilizing any of the deposition techniques as described herein. The layer 103 is formed to have a suitable thickness, e.g., in the range from about 2 nm to 500 nm. In one example, the thickness range of layer 103 can be within the range from about 2 nm to about 15 nm.

In addition, the layer of ferroelectric material 103 can be formed to include, in addition to the ferroelectric material, dopants or further additives that may support the crystallization of the layer 103 into a state having ferroelectric properties. The additives can be included with the precursor materials, e.g., so as to be included during formation of the layer 103. Alternatively, the additives can be introduced into the formed layer 103 by ion implantation or any other suitable process. A concentration of the further additives within the layer may be set within a range from about 0.05 at % (atomic percent, as measured by ratio of additive atoms to ferroelectric material atoms) to about 30 at %, within a range from about 0.05 at % to about 10 at %, within a range from about 0.05 at % to about 5 at %, within a range from about 0.5 at % to about 3.5 at %, or a range from about 1 at % to about 3.5 at %. In general, the amount of the further additives may depend on the thickness of the layer 103. When increasing the thickness of the layer 103, the concentration of the further additives may also have to be increased to achieve a desired crystallization having ferroelectric properties.

Any suitable additives may be provided within the ferroelectric material of layer 103 including, without limitation, any one or more of N, C, Si, Al, Ge, Sn, Sr, Mg, Ca, Sr, Ba, Ti, Zr, Hf, Gd, Sc, La (e.g., providing Zr as an additive in a $HfO_2$ layer), Ti, and any one or more of the rare earth elements (e.g., Y, Gd, etc.). In particular, it has been determined that certain additives having an atomic radius that is about the same as or greater than Hf are particularly suitable as dopants for optimizing ferroelectric (FE) properties of the ferroelectric material of layer 103 when utilizing Hf in the layer. In contrast, certain additives having an atomic radius smaller than Hf can cause anti-ferroelectric (anti-FE) properties at phase boundaries between the monoclinic and tetragonal/cubic phases of $HfO_2$. It has further been determined that additives having an atomic radius about the same as or greater than Hf can be doped at larger ranges of concentrations within the ferroelectric material of layer 103 in relation to other additives while still supporting FE properties of the ferroelectric material of layer 103. Other additives having the same valence as Hf can also be beneficial as dopants to reduce charge trapping characteristics of the ferroelectric material of layer 103 by reducing open bonds within the $HfO_2$ host lattice of the material.

The conductive layer 106 for the examples of FIG. 5a provides a covering layer for the ferroelectric material of layer 103 and can also serve as an electrode for the implementation of the MFS (e.g., gate electrode) within a semiconductor logic gate structure.

After the layers have been formed, an anneal process is carried out at one or more suitable temperatures and for one or more suitable time periods to achieve a suitable amount of crystallization for the ferroelectric material within the ferroelectric material of layer 103. In particular, the anneal process is carried out to heat the ferroelectric material of layer 103 to a temperature that is above the crystallization temperature of the ferroelectric material so as to at least partially alter its crystal state from amorphous to crystalline, thus resulting in a crystallized oxide within the ferroelectric material of layer 103. A crystallization temperature may be chosen in a range of, e.g., from about 400° C. to about 1,200° C. depending on the thermal budget of the used devices. A preferred crystallization temperature for the annealing process is at a temperature that is above the onset of crystallization for the ferroelectric material (when the ferroelectric material is still amorphous, i.e., after the layer 103 is deposited) and is further greater than about 500° C., or at a temperature that is above the onset of crystallization for the ferroelectric material and is further greater than about 300° C. The time period for annealing can be from about 0.01 second to about 12 hours. These annealing temperature ranges induce partial or full crystallization of the ferroelectric material of layer 103.

The partial crystallization of the ferroelectric material of layer 103 results in ferroelectric domains within the layer 103 that are in a ferroelectric state (i.e., at least partially). The crystallized layer 103 may exhibit different dipole moments. The orientation of the dipole moments in the crystallized layers 103 can result in a variation of the coercive voltage of the individual domains. By applying suitable voltages to the layer stack 109 the dipole orientation can be switched for a portion of ferroelectric domains with a coercive voltage that is lower than the applied voltage, while other domains stay unaffected and no change of the dipole orientation is induced for domains with a coercive voltage that is greater than the applied voltage. In other words, the ferroelectric polarization of the ferroelectric film 103 can be partially switched. In this way, more than two polarization states can be stored in the layer stack 109, representing multiple binary logic states. Thus, within one ferroelectric logic gate structure one or more logic states can be stored, i.e., one bit with two polarization states or two bits with four polarization states or three bits with eight polarization states. For example the MFS structure 100 can be used to form a FeFET, where the channel conductivity in the FeFET depends upon the dipole orientation of the ferroelectric material of layer 103 of the layer stack 109 of the MFS structure 100.

The various layers 103, 105, 106 of the structures 100 depicted in FIG. 5a can be patterned at any time after formation of the layers, either before or after the annealing process to crystallize the ferroelectric material of layer 103. The patterning of these layers may be carried out by an etch process using an etch mask (e.g., a hard mask), where the patterning of the layers can be carried out based upon the intended use of these layers. For example, the layers may be patterned to define at least part of a gate stack of a 1T FeFET. Any suitable spacer structures may also be formed (e.g., utilizing any suitable deposition technique, such as any of the deposition techniques previously described herein) after patterning the layers.

It is to be understood that the layer stack 109 can comprise a single layer of ferroelectric material, or in another embodiment can comprise a multitude of layers of ferroelectric material, or in another embodiment can comprise additional conductive or isolating interfacial layers, separating the individual layers of ferroelectric material.

Further processing of the carrier or support structure to integrate other components in relation to the support structure can be implemented before, after or together with the formation of the structure 100. For example, with reference to FIG. 5b an isolating layer 112 might be formed in between the substrate 113 and the carrier layer 101 thus forming a silicon on insulator structure. Both, substrate 113 and carrier layer 101 may be doped prior to or after formation of structure 100. Moreover, source/drain regions 102 of the ferroelectric logic gates may be formed before, after or together with the ferroelectric layer.

It is further noted that the MFS structure 100 can also be formed with any one or more suitable geometries including, without limitation, planar or 3D geometry such as Trench MOSFET, FinFET, RCAT ("Recessed Channel Array Transistor"), TSNWFET ("Twin Silicon NanoWire Field Effect Transistor"), PiFET ("Partially insulated Field Effect Transistor"), McFET ("Multi-channel Field Effect Transistor").

It is further noted that the Source and Drain regions 102 of MFS structure 100 can also be formed as metallic regions, thus forming a SFET ("Schottky-Transistor").

It is further noted that the Source and Drain regions 102 of MFS structure 100 can also be formed with two different dopants species to form a TFET ("Tunneling Field Effect Transistor").

Figure 6:
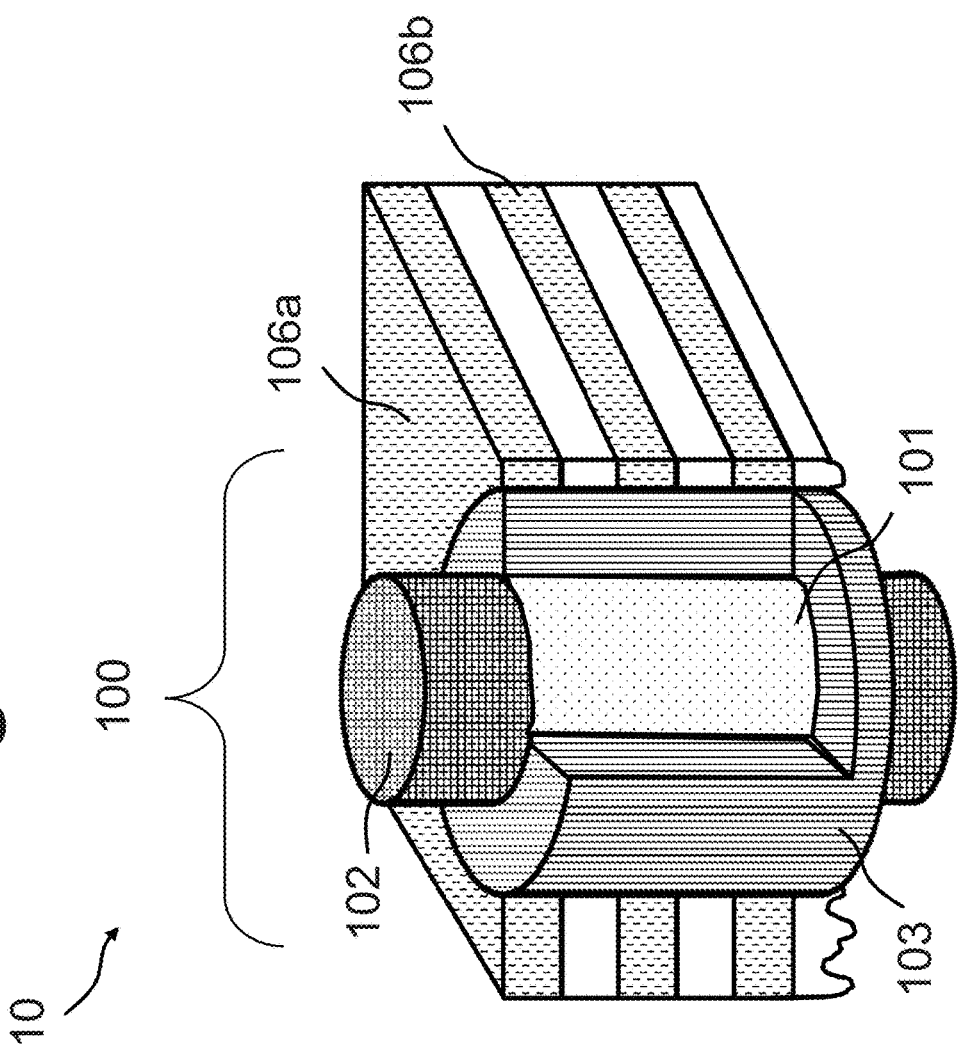
FIG. 6 is a schematic and perspective view illustrating a ferroelectric logic gate formed in a vertical trench geometry as part of a vertical 3D structure, according to one example.

It is further noted that the MFS structure 100 can also be formed with any one or more suitable geometries including, without limitation, vertical 3D geometry such as BICS (Bit Cost Scaleable), VNAND (Vertical NAND), TCAT (Terabit Cell Array Transistor) or such, where the ferroelectric material layer 103 might be formed in a vertical trench geometry, as illustrated by the example of FIG. 6. In that way a higher integration density of the ferroelectric logic gates might be attained.

It is to be understood that the patterning of the layer of ferroelectric material can be performed in a different way than by etching. In another embodiment, the layer of ferroelectric material is deposited into a pre-structured trench, thus confining the formation of the domains. In another example, the layer of ferroelectric material is deposited self-aligned by self-aligned selective growth on top of a pre-structured supporting structure 101, thus confining the formation of the domains. In this way, the targeted formation of ferroelectric domains with targeted size can be realized in order to adjust the switching properties of the single domains.

It is to be understood that the resistive element 130 in the ferroelectric logic gate 10 can be formed in the support structure 101. By way of example, with reference to FIG. 5c and FIG. 5d, the resistive element can be realized as a transistor structure with Source/Drain regions 102a and 102b, a gate electrode 106b and a gate oxide 104. Source/Drain region 102a of resistive element and one out of two Source/Drain regions of the FeFET 100 might be shared. The gate oxide 104 may be manufactured before, after or together with the layer of ferroelectric material 103.

It is to be understood that the resistive element 130 of the ferroelectric logic gate 10 can be formed in the wiring area including a stack of conductive layers, e.g. metal layers, and intermediate dielectrics that may be formed over portions of the support structure 101, where the wiring area may be used to interconnect semiconductor devices or circuit parts of the integrated circuit.

It is to be understood that the resistive element 130 of the ferroelectric logic gate 10 might be shared among several ferroelectric logic gates. In one example embodiment two or more FeFET devices 100 can be connected to only one resistive element 130, thus sharing the resistive element. In that way the overall size of the circuit can be reduced. Moreover, the combination of more than one ferroelectric logic gates within such combined circuit can be used to realize more complex logic functionality.

It is to be understood that polarization-based logic gate 10 forms a part of an integrated circuit 30. For example, an integrated circuit 30 may comprise a plurality of ferroelectric logic gates 10 arranged in the form of a compact ferroelectric logic gate array or in a sparse arrangement of single ferroelectric logic gates. Additional circuits may also be formed in the support structure 101. By way of example, these additional circuits may include word line drive circuits, bit line drive circuits, source line drive circuits, sense circuits, control circuits, and any other suitable circuits for the integrated circuit. In general, any semiconductor devices, e.g., diodes, bipolar transistors, diffusion resistors, silicon controlled rectifiers (SCR), and field effect transistors (FET), may be formed within the support structure 101. In addition, a wiring area including a stack of conductive layers, e.g. metal layers, and intermediate dielectrics may be formed over portions of the support structure 101, where the wiring area may be used to interconnect semiconductor devices or circuit parts of the integrated circuit.

While the examples described herein are in relation to 1T ferroelectric logic gates (FeFETs), examples according to the present disclosure are not limited to such ferroelectric logic gates but instead can be applied to any suitable type of ferroelectric logic gate with a layer of ferroelectric material.

The examples described herein enhance the performance of a ferroelectric logic gate and increase an integration density associated with the ferroelectric logic gate. Moreover, multiple polarization states of the layer stack 109 enable the storage of multiple bits within one ferroelectric logic gate. Thus the overall complexity of the logic operation can be increased.

As describe herein, polarization-based logic gates 10 (e.g., ferroelectric logic gates) may be directly integrated into a processor unit such that information processing and information storage are performed within the same LiM circuit. In this way the information transmission between processor and memory array is avoided and the von-Neumann bottleneck is overcome.

What is claimed is:

1. A polarization-based logic gate comprising:
   a transistor having a drain and including a polarizable material layer having a polarization state settable to any polarization state from among at least two polarization states, the polarization state to which the polarizable material layer is set representing a first logic value;
   a resistive element having a first terminal coupled to the drain and a second terminal; and
   a plurality of input/output terminals connected to the transistor and second terminal of the resistive element so as to apply voltages to selected input/output terminals, including a sensing voltage representing a second logic value applied to a gate of the transistor, with a resulting drain current of the transistor at least partially flowing through the resistive element and representing a result of a logic operation between the first logic value and the second logic value.

2. The logic gate of claim 1, the transistor including a gate, a source, and a bulk terminal, the source and bulk terminal coupled to ground via the plurality of input/output terminals, and the sensing voltage applied to the gate via the plurality of input/output terminals such that the logic operation represents both a logic AND operation and a logic NAND operation.

3. The logic gate of claim 1, the transistor including a gate, a source, and a bulk terminal, the source coupled to ground via the plurality of input/output terminals, the plurality of input/output terminals applying the sensing voltage to the gate, and applying a first back-bias voltage to the bulk terminal such that the logic operation represents both a logic OR operation and a logic NOR operation.

4. The logic gate of claim 3, the input/output terminals applying a second back-bias voltage different from the first back-bias voltage to the bulk terminal such that the logic operation represents both an AND operation and a NAND operation.

5. The logic gate of claim 1, the transistor including a gate, a source, and a bulk terminal, the bulk terminal and source connected via the plurality of input/output terminals to form a single input terminal, and the gate and second terminal of the resistive device connected via the plurality of input/output terminals to form a single output terminal such that the logic gate comprises a two terminal synaptic circuit.

6. The logic gate of claim 1, the transistor comprising a FeFET.

7. The logic gate of claim 1, the resistive element comprising one of a resistor, a diode, and a transistor, where a conductivity of the transistor can be controlled via a control voltage applied to a gate of the transistor.

8. A polarization-based configurable logic gate comprising:
   a transistor having gate, source, drain and body contacts, and including a polarizable material layer having a polarization state settable to any polarization state from among at least two polarization states, the polarization state to which the polarizable material is set representing a first logic value;
   a resistive element having a first terminal coupled to the drain and a second terminal; and
   a plurality of input/output terminals connected to the transistor contacts and to the second terminal of the resistive element, interconnections between the plurality of input/output terminals being configurable into different interconnection configurations, each interconnection configuration having corresponding logic operations and configured to apply an operational voltage to the second terminal of the resistive element and a sensing voltage representing a second logic value across the polarizable material layer with a resulting current flow through the resistive element representing results of the corresponding logic operations between the first logic value and the second logic value.

9. The configurable logic gate of claim 8, including a first input/output terminal coupled to the gate contact, a second input/output terminal coupled to the second terminal of the resistive element, a third input/output terminal coupled to the source contact, a fourth input/output terminal coupled to the drain contact, and a fifth input/output terminal coupled to the body contact.

10. The configurable logic gate of claim 9, a first interconnection configuration including the third and fifth input/output terminals being connected to ground, the second input/output terminal applying the operational voltage, and the first input/output terminal applying the sensing voltage, with the corresponding logic operations comprising logic AND and logic NAND operations.

11. The configurable logic gate of claim 10, a drain current indicating a result of the logic AND operation and a voltage at the fourth input/output terminal indicating a result of the logic NAND operation.

12. The configurable logic gate of claim 9, a second interconnection configuration including the third input/output terminal connected to ground, the fifth input/output terminal applying a non-zero body voltage; the second input/output terminal applying the operational voltage, and the first input/output contact applying the sensing voltage, with the corresponding logic operation comprising logic OR and logic NOR operations.

13. The configurable logic gate of claim 12, a drain current indicating a result of the logic OR operation and a voltage at the fourth input/output terminal indicating a result of the logic NOR operation.

14. The configurable logic gate of claim 9, a third interconnection configuration including the second input/output terminal being connected to the first input/output terminal, the third input/output terminal being connected to the fifth input/output terminal, with the first and third input/output terminals applying a voltage and the fourth input/output terminal floating, such that the third interconnection configures the configurable logic gate as a two terminal synaptic circuit.

15. The configurable logic gate of claim 8, the transistor comprising a FeFET.

16. The configurable logic gate of claim 8, the resistive element comprising one of a resistor, a diode, and a transistor, where a conductivity of the transistor can be controlled via a control voltage applied to a gate of the transistor.

17. A configurable logic cell comprising:
   a FeFET including a gate, a source, a drain, and a bulk terminal;
   a resistor having a first terminal connected to the drain and a second terminal;
   a first input/output terminal connected to the gate;
   a second input/output terminal connected to the second terminal of the resistor
   a third input/output terminal connected to the source;
   a fourth input/output terminal connected to the drain; and a fifth input/output terminal connected to the bulk terminal;

the FeFET having a polarization layer having a polarization state settable to any polarization state from among at least two polarization states, the polarization state to the which polarization layer is set representing a first logic value, the configurable logic cell including configurable interconnections between the input/output terminals arranged so as to apply voltages to selected input/output terminals, including a sensing voltage representing a second logic value applied to the second input/output terminal, with a resulting drain current of the transistor representing a result of a logic operation between the first logic value and the second logic value.

18. A method of performing a logic operation including: providing a configurable logic gate including:

a transistor having a drain and including a polarizable material layer having a polarization state settable to any polarization state from among at least two polarization states, the polarization state to which is the polarizable is set representing a first logic value;

a resistive element having a first terminal coupled to the drain and a second terminal;

providing a programming voltage across the polarizable material layer to program the polarizable material layer to a desired polarization state;

providing a sensing voltage representing a second logic value to a plurality of input/output terminals connected to the transistor and second terminal of the resistive element so as to apply voltages to selected input/output terminals, including a sensing voltage representing a second logic value, with a resulting drain current of the transistor at least partially flowing through the resistive element and representing a logic operation between the first and second logic values, where the logic operation depends on an interconnection configuration between terminals of the transistor and the second terminal of the resistive element.

19. The method of claim 18, wherein the polarization state to which the polarizable material is set represents a stored logic value.

* * * * *